US009350356B2

(12) United States Patent
Tatsumura et al.

(10) Patent No.: US 9,350,356 B2
(45) Date of Patent: May 24, 2016

(54) RECONFIGURABLE CIRCUIT

(71) Applicant: KABUSHIKI KAISHA TOSHIBA, Tokyo (JP)

(72) Inventors: Kosuke Tatsumura, Kanagawa (JP); Masato Oda, Kanagawa (JP); Koichiro Zaitsu, Kanagawa (JP); Shinichi Yasuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/842,195

(22) Filed: Sep. 1, 2015

(65) Prior Publication Data
US 2016/0079983 A1   Mar. 17, 2016

(30) Foreign Application Priority Data

Sep. 17, 2014  (JP) .................................. 2014-188754

(51) Int. Cl.
*H03K 19/177*       (2006.01)
*H01L 25/00*        (2006.01)
(Continued)

(52) U.S. Cl.
CPC .......... *H03K 19/17728* (2013.01); *B82Y 10/00* (2013.01); *H01L 23/5252* (2013.01); *H01L 24/45* (2013.01); *H01L 25/0655* (2013.01);
(Continued)

(58) Field of Classification Search
CPC ............ H03K 19/02; H03K 19/17748; H03K 3/356008; H03K 3/0375; H03K 3/356182; H03K 17/223; H03K 19/1776; B82Y 10/00; H01L 2224/73265; H01L 23/5252; H01L 24/45; H01L 24/48; H01L 25/0655; H01L 27/0688; H01L 27/092; H01L 27/10; H01L 27/105; G11C 2213/71
See application file for complete search history.

(56) References Cited

U.S. PATENT DOCUMENTS 6,339,341 B1     1/2002   Fujii et al.
8,273,610 B2 *   9/2012   Or-Bach .................. G11C 8/16
                                                257/E23.101

(Continued)

FOREIGN PATENT DOCUMENTS

EP       2 662 861 A2     11/2013
JP       2000-232162      8/2000
(Continued)

OTHER PUBLICATIONS

Miyamura, M., et al., "First Demonstration of Logic Mapping on Nonvolatile Programmable Cell Using Complementary Atom Switch", IEDM12-247, p. 10.6.1 to 10.6.4 (2012).
(Continued)

*Primary Examiner* — Vibol Tan
(74) *Attorney, Agent, or Firm* — Finnegan, Henderson, Farabow, Garrett & Dunner, LLP

(57) ABSTRACT

According to one embodiment, a reconfigurable circuit includes first, second, third and fourth circuit blocks arranged with a matrix, a first conductive line shared by the first and second circuit blocks, a second conductive line shared by the third and fourth circuit blocks, a third conductive line shared by the first and third circuit blocks, the third conductive line crossing the first and second conductive lines, a fourth conductive line shared by the second and fourth circuit blocks, the fourth conductive line crossing the first and second conductive lines, a first controller controlling voltages to be applied to the first and second conductive lines, and a second controller controlling voltages to be applied to the third and fourth conductive lines.

19 Claims, 17 Drawing Sheets

(51) Int. Cl.
  H03K 17/22    (2006.01)
  B82Y 10/00    (2011.01)
  H03K 3/356    (2006.01)
  H03K 3/037    (2006.01)
  H01L 23/525   (2006.01)
  H01L 23/00    (2006.01)
  H01L 25/065   (2006.01)
  H01L 27/092   (2006.01)
  H01L 27/105   (2006.01)

(52) U.S. Cl.
  CPC ............ *H01L 27/092* (2013.01); *H01L 27/105* (2013.01); *H03K 3/0375* (2013.01); *H03K 3/356008* (2013.01); *H03K 3/356182* (2013.01); *H03K 17/223* (2013.01); *H03K 19/1776* (2013.01); *H03K 19/17748* (2013.01)

(56) References Cited

U.S. PATENT DOCUMENTS

| | | | |
|---|---|---|---|
| 8,531,866 B2 | 9/2013 | Ikegami et al. | |
| 8,546,861 B2* | 10/2013 | Hwang | G11C 13/0007 257/298 |
| 8,553,445 B2* | 10/2013 | Baek | G11C 5/025 365/148 |
| 8,730,710 B2* | 5/2014 | Baek | G11C 5/025 365/148 |
| 8,772,748 B2* | 7/2014 | Yasutake | G11C 13/0004 257/3 |
| 8,971,093 B2* | 3/2015 | Murooka | G11C 13/0097 365/148 |
| 9,099,526 B2* | 8/2015 | Or-Bach | H01L 21/6835 |
| 9,136,153 B2* | 9/2015 | Or-Bach | G11C 8/16 |
| 9,184,174 B2* | 11/2015 | Yun | H01L 27/1157 |
| 2005/0045919 A1 | 3/2005 | Kaeriyama et al. | |
| 2012/0026779 A1 | 2/2012 | Ikegami et al. | |

FOREIGN PATENT DOCUMENTS

| | | |
|---|---|---|
| JP | 2005-101535 | 4/2005 |
| JP | 2010-225194 | 10/2010 |
| JP | 2013-236082 | 11/2013 |
| JP | 2015-018590 | 1/2015 |

OTHER PUBLICATIONS

Miyamura, M., et al., "Programmable Cell Array Using Rewritable Solid-Electrolyte Switch Integrated in 90nm CMOS", ISSCC, Session 12, Design in Emerging Technologies, 12.7. IEEE international Solid-State Circuits Conference (2011), pp. 228-229.

Tada, M., et al., "Nonvolatile Crossbar Switch Using $TiO_x$/$TaSiO_y$ Solid Electrolyte", IEEE Transactions on Electron Devices, vol. 57, No. 8, (Aug. 2010), p. 1987-1995.

Sasago, Y., et al., "Cross-point phase change memory with $4F^2$ cell size driven by low-contact-resistivity poly-Si diode", 2009 Symposium on VLSI Technology Digest of Technical Papers, p. 24-25 (2009).

* cited by examiner

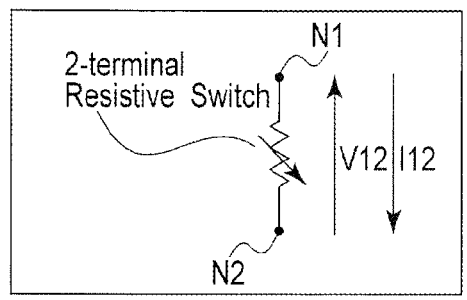
F I G. 5
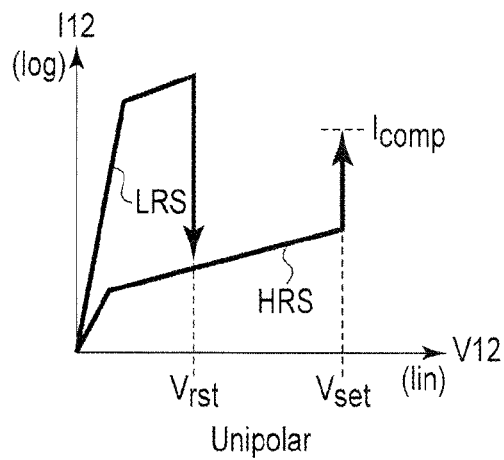
F I G. 6
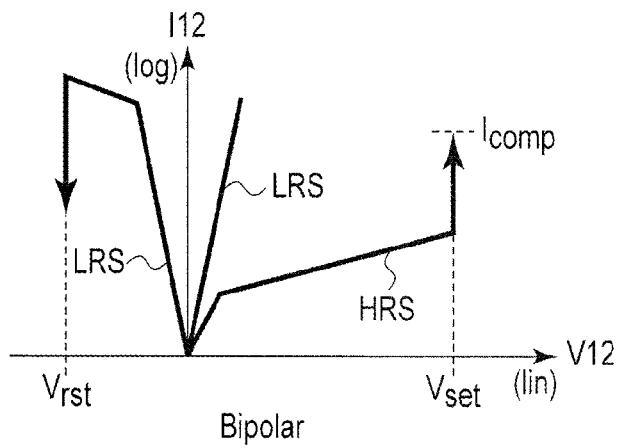
F I G. 7

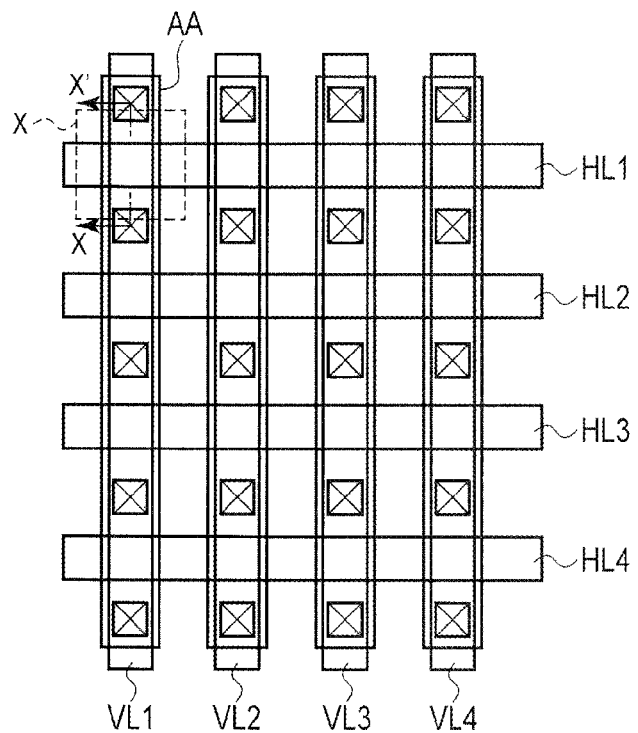
F I G. 8
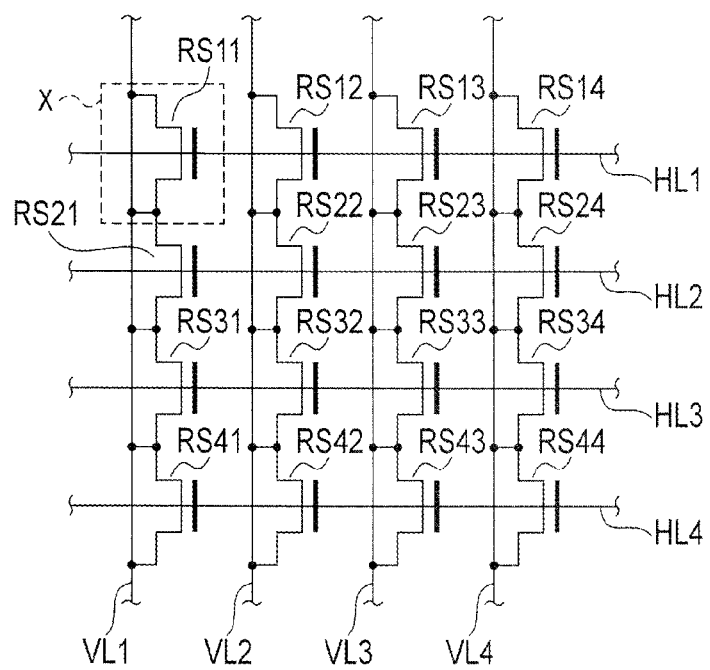
F I G. 9

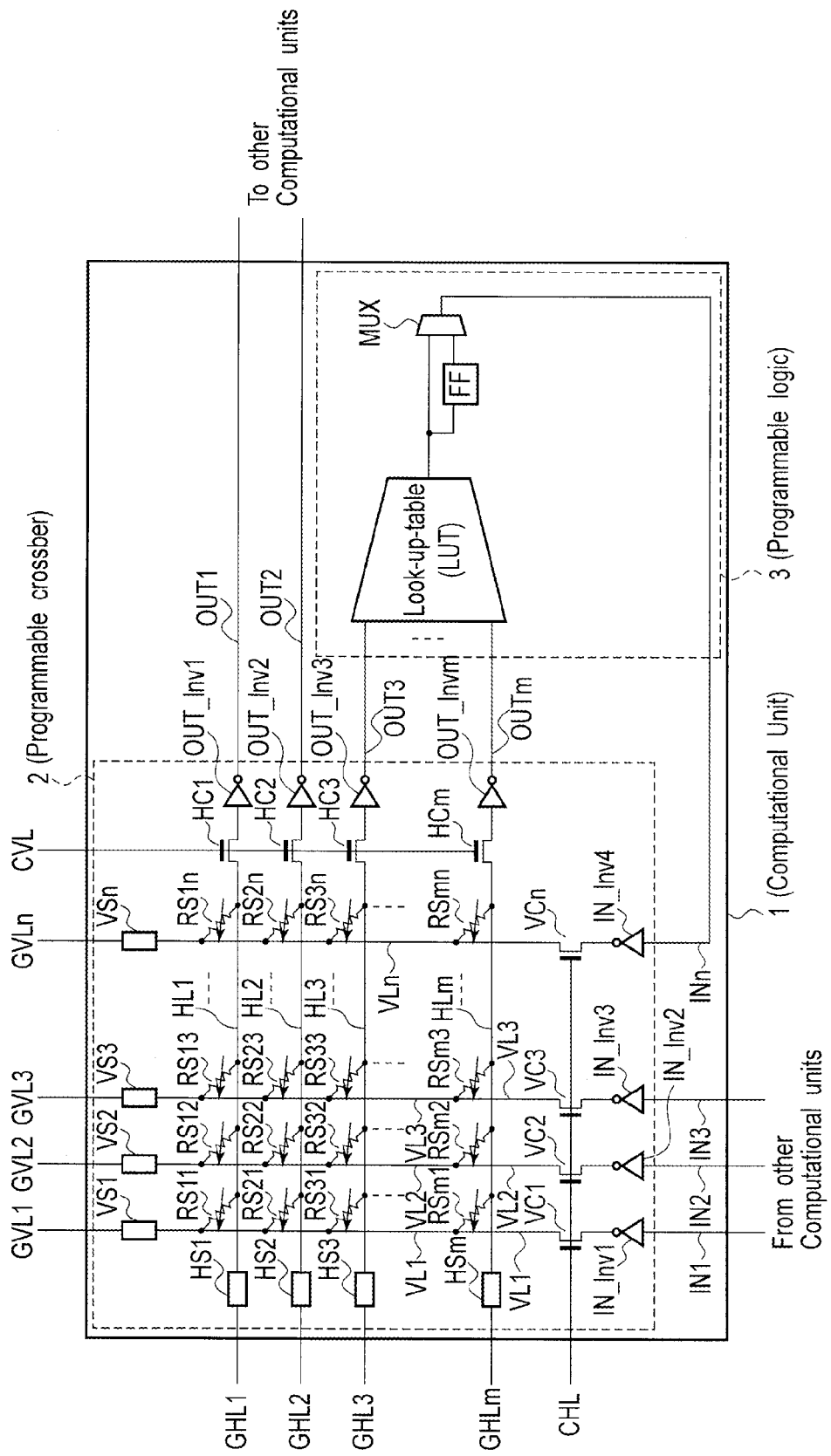
F I G. 13

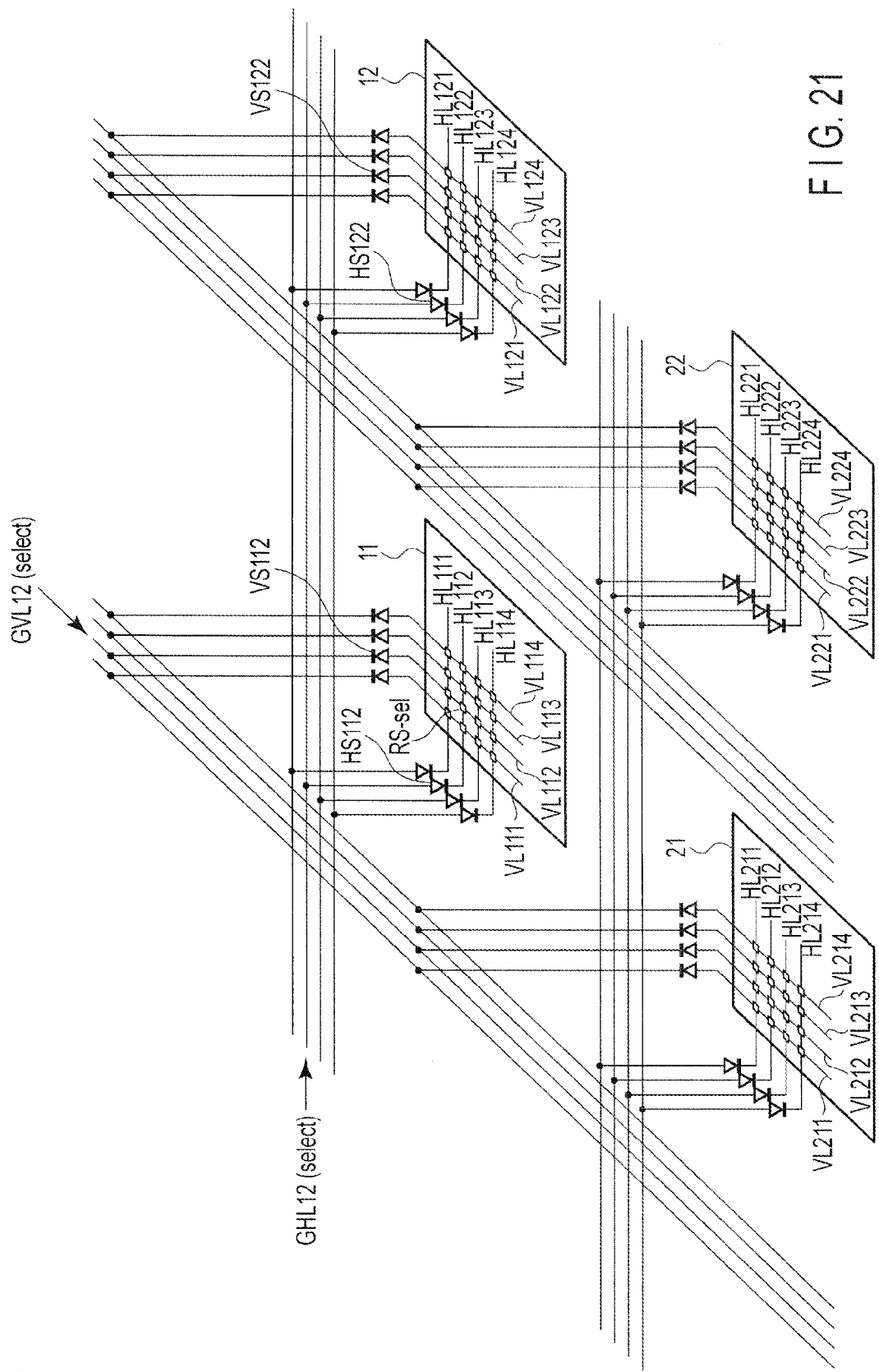
F I G. 21

|  | | SET | RESET |
|---|---|---|---|
| GHL | select | $V_{set}$ | $V_{rst}$ |
|  | unselect | $V_{set}/2$ | $V_{rst}/2$ |
| GVL | select | GND | GND |
|  | unselect | $V_{set}/2$ | $V_{rst}/2$ |

F I G. 22

|  | Operation |
|---|---|
| GHL | GND |
| GVL | Vcc |

F I G. 23

|  | | SET | RESET |
|---|---|---|---|
| GHL | select | $V_{set}$ | GND |
| | unselect | $V_{set}/2$ | $V_{rst}/2$ |
| GVL | select | GND | $V_{rst}$ |
| | unselect | $V_{set}/2$ | $V_{rst}/2$ |

F I G. 25

|  | Operation |
|---|---|
| GHL | $Vcc/2$ |
| GVL | $Vcc/2$ |

F I G. 26

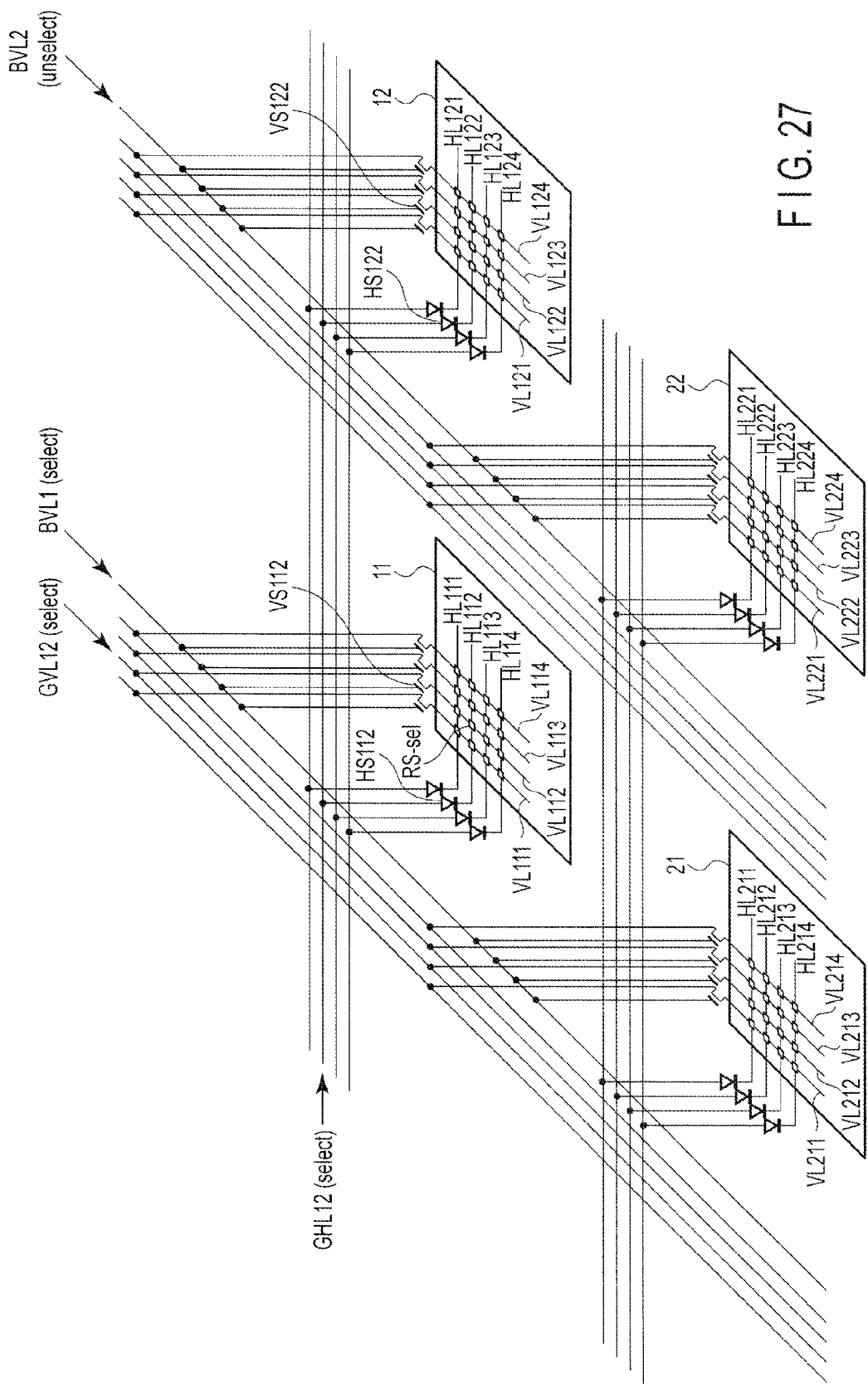
F I G. 27

|  |  | SET | RESET |
|---|---|---|---|
| GHL | select | $V_{set}$ | $V_{rst}$ |
|  | unselect | $V_{set}/2$ | $V_{rst}/2$ |
| BVL | select | $V_{on}$ | $V_{on}$ |
|  | unselect | $V_{off}$ | $V_{off}$ |
| GVL | select | GND | GND |
|  | unselect | $V_{set}/2$ | $V_{rst}/2$ |

F I G. 28

|  | Operation |
|---|---|
| GHL | GND |
| BVL | $V_{off}$ |
| GVL | Float |

F I G. 29

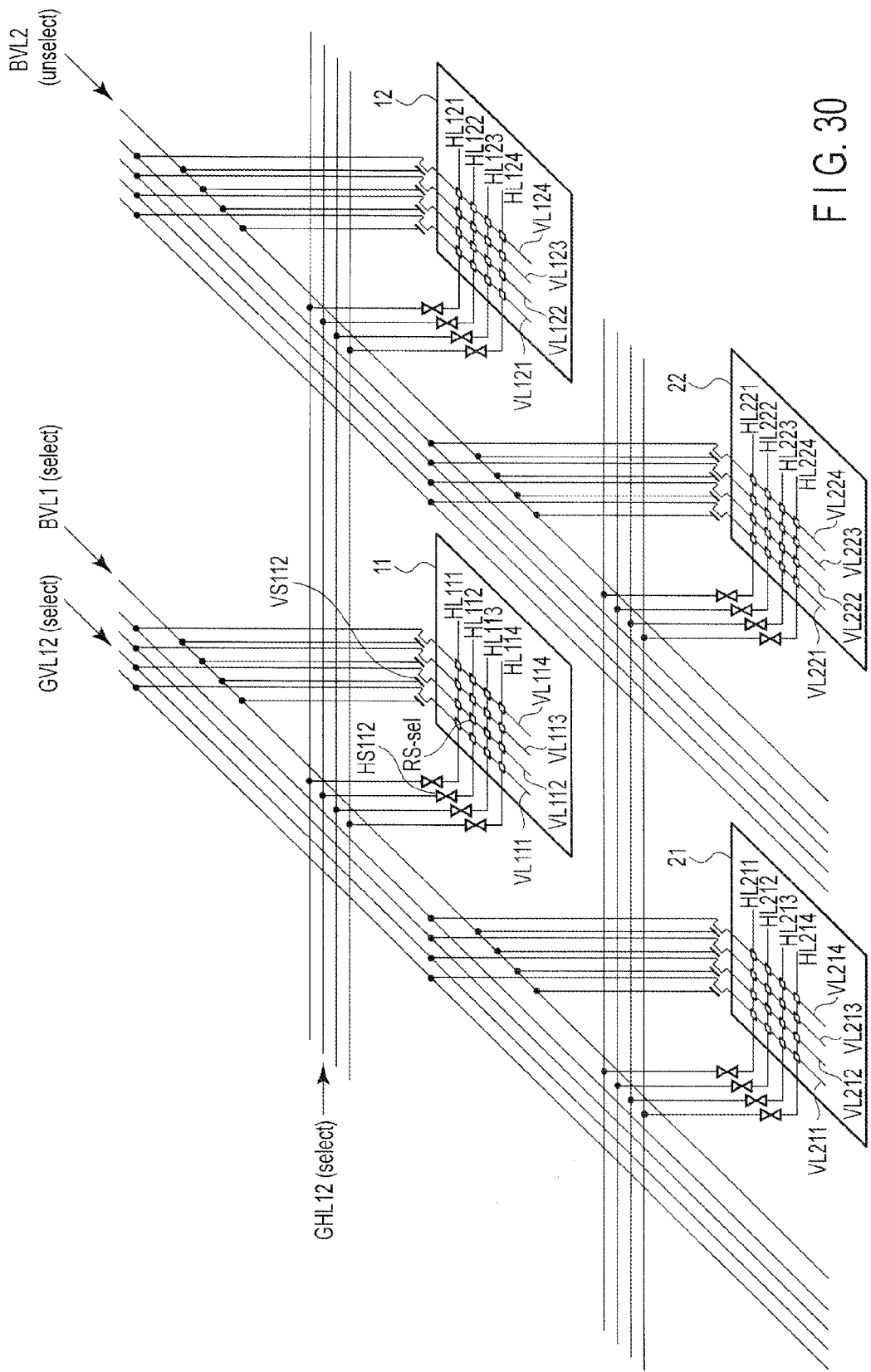
F I G. 30

|  | | SET | RESET |
|---|---|---|---|
| GHL | select | $V_{set}$ | GND |
| | unselect | $V_{set}/2$ | $V_{rst}/2$ |
| BVL | select | $V_{on}$ | $V_{on}$ |
| | unselect | $V_{off}$ | $V_{off}$ |
| GVL | select | GND | $V_{rst}$ |
| | unselect | $V_{set}/2$ | $V_{rst}/2$ |

FIG. 31

|  | Operation |
|---|---|
| GHL | Vcc/2 |
| BVL | $V_{off}$ |
| GVL | Float |

FIG. 32

RECONFIGURABLE CIRCUIT

CROSS-REFERENCE TO RELATED APPLICATIONS

This application is based upon and claims the benefit of priority from Japanese Patent Application No. 2014-188754, filed Sep. 17, 2014, the entire contents of which are incorporated herein by reference.

FIELD

Embodiments described herein relate generally to a reconfigurable circuit.

BACKGROUND

A programmable logic device (PDL) typified by a field programmable gate array (FPGA) is a semiconductor integrated circuit which is reconfigurable even after a chip is manufactured. An island-style of PLD comprises a plurality of identical computational units arranged two-dimensionally. The computational units comprise programmable wiring resources and programmable logic resources.

The programmable wiring resources each include a programmable crossbar which comprises a group of lines, another group of lines perpendicular to the above group of lines, switches for switching the mutual connection relationship between the groups of lines, and memories for recording a mutual connection relationship. The programmable crossbar is sometimes referred to as a programmable interconnect or a programmable switch matrix.

It is known in technique that a programmable crossbar is made to comprise a group of lines, another group of lines perpendicular to the former group of lines, and a plurality of resistance change elements provided at intersections of those groups of lines. Each of the resistance change elements is a two-terminal nonvolatile resistance change element, and its state can be switched between a low resistance state and a high resistance state by applying a predetermined voltage between terminals of the nonvolatile resistance change element.

To be more specific, a programmable crossbar in a computational unit is connected to a programmable logic resource in the computational unit, and also to another computational unit. In addition, the programmable crossbar is also connected to a program control circuit. The program control circuit comprises a program voltage control circuit and program lines. The program control circuit is shared among the plurality of computational units. It is therefore necessary that the program lines are connected to programmable crossbars in the computational units by selectors. During a program operation, the selectors connect the program control circuit and a selected programmable crossbar, and during a PLD operation, the selectors disconnect the programmable crossbars from the program control circuit.

Also, it is known in technique that a selector is made to comprise a three-terminal metal-oxide-semiconductor field-effect-transistor (MOSFET). The MOSFET is sometimes referred to as a programming transistor. The programming transistor needs to have a sufficient withstand voltage or a sufficient current driving performance for transmitting a program voltage pulse from a two-terminal nonvolatile resistance change element. Thus, there is a case where its footprint is larger.

It is required to provide a technique for increasing the logic density of a PLD. The logic density can be increased by applying programmable crossbars employing two-terminal resistance change elements. Furthermore, in order to increase the logic density, it is required to provide programmable crossbars including selectors which can be provided in a smaller footprint, and a program operation method and a PLD operation method for the programmable crossbars.

BRIEF DESCRIPTION OF THE DRAWINGS

FIG. 5 is a view showing an example of a two-terminal resistance change element;

FIG. 6 is a view showing an IV characteristic of the element as shown in FIG. 5 where the element as shown in FIG. 5 is unipolar;

FIG. 7 is a view showing an IV characteristic of the element as shown in FIG. 5 where the element as shown in FIG. 5 is bipolar;

FIG. 8 is a view showing a configuration example of another programmable crossbar;

FIG. 9 is a view showing an equivalent circuit in the programmable crossbar as shown in FIG. 8;

FIG. 13 is a view showing a configuration example of a computational unit;

FIG. 21 is a view showing an application example of a reconfigurable circuit;

FIG. 22 is a view showing a set/reset operation of the circuit as shown in FIG. 21;

FIG. 23 is a view showing a PLD operation of the circuit as shown in FIG. 21;

FIG. 25 is a view showing a set/reset operation of the circuit as shown in FIG. 24;

FIG. 26 is a view showing a PLD operation of the circuit as shown in FIG. 24;

FIG. 27 is a view showing an application example of still another reconfigurable circuit;

FIG. 28 is a view showing a set/reset operation of the circuit as shown in FIG. 27;

FIG. 29 is a view showing a PLD operation of the circuit as shown in FIG. 27;

FIG. 30 is a view showing an application example of a further reconfigurable circuit;

FIG. 31 is a view showing a set/reset operation of the circuit as shown in FIG. 30; and FIG. 32 is a view showing a PLD operation of the circuit as shown in FIG. 30.

DETAILED DESCRIPTION

In general, according to one embodiment, a reconfigurable circuit comprises: first, second, third and fourth circuit blocks arranged with a matrix; a first conductive line shared by the first and second circuit blocks; a second conductive line shared by the third and fourth circuit blocks; a third conductive line shared by the first and third circuit blocks, the third conductive line crossing the first and second conductive lines; a fourth conductive line shared by the second and fourth circuit blocks, the fourth conductive line crossing the first and second conductive lines; a first controller controlling voltages to be applied to the first and second conductive lines; and a second controller controlling voltages to be applied to the third and fourth conductive lines. Each of the first, second, third and fourth circuit blocks comprises: a fifth conductive line; a sixth conductive line crossing the fifth conductive line; a resistance change element including first and second terminals, the first terminal being connected to the fifth conductive line, the second terminal being connected to the sixth conductive line; a first selecting element including first and second terminals as a current path, the first terminal being connected to the fifth conductive line; and a second selecting element including first and second terminals as a current path, the first terminal being connected to the sixth conductive line. The second terminal of the first selecting element in the first circuit block is connected to the first conductive line, and the second terminal of the second selecting element in the first circuit block is connected to the third conductive line. The second terminal of the first selecting element in the second circuit block is connected to the first conductive line, and the second terminal of the second selecting element in the second circuit block is connected to the fourth conductive line. The second terminal of the first selecting element in the third circuit block is connected to the second conductive line, and the second terminal of the second selecting element in the third circuit block is connected to the third conductive line. The second terminal of the first selecting element in the fourth circuit block is connected to the second conductive line, and the second terminal of the second selecting element in the fourth circuit block is connected to the fourth conductive line. One of the first and second selecting elements is a nonlinear resistance element, and the other of the first and second selecting elements is a nonlinear resistance element or a transistor.

Embodiments will be described hereinafter with reference to the accompanying drawings.

Figure 1:
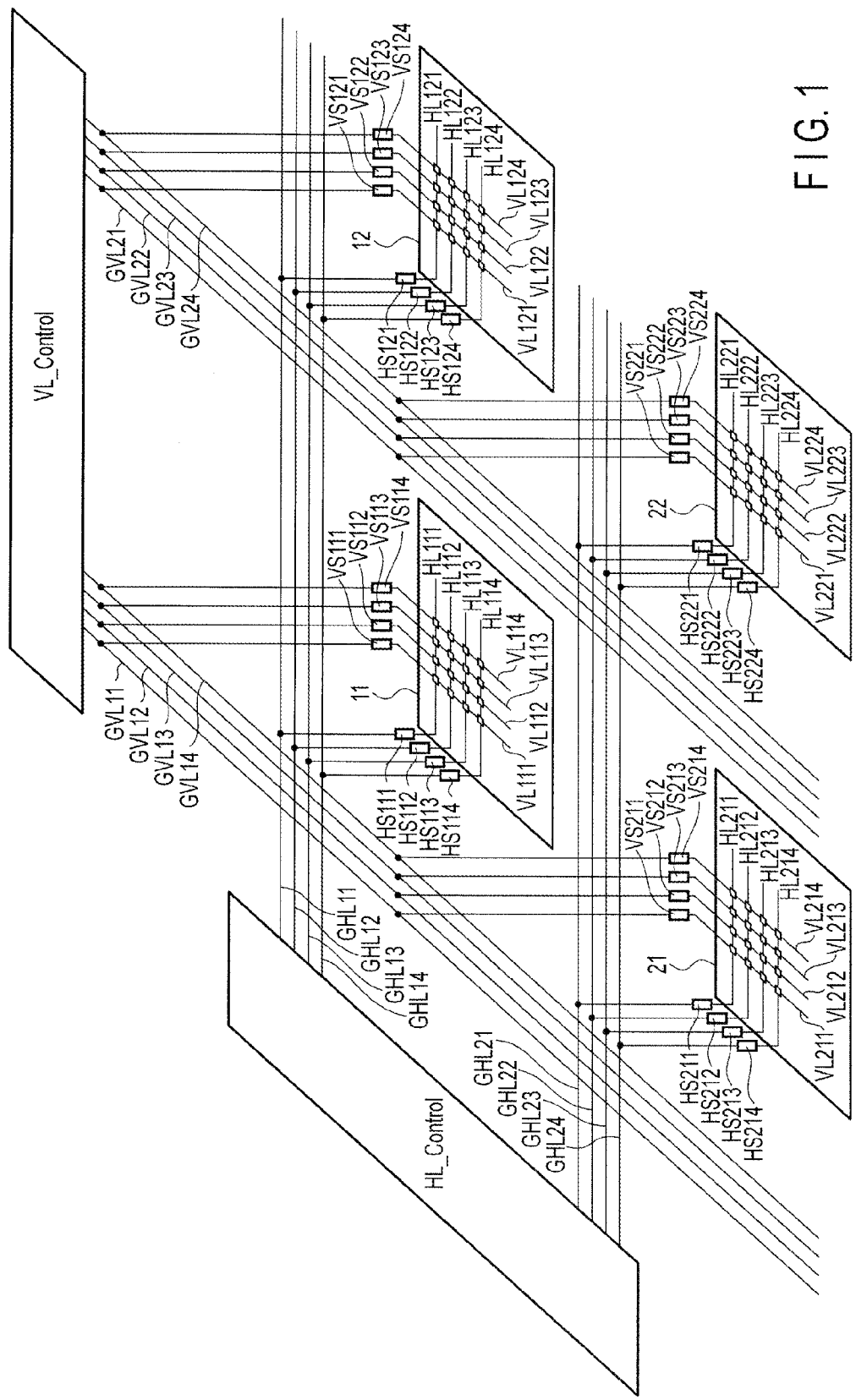
FIG. 1 is a view showing a first example of a reconfigurable circuit.

FIG. 1 shows arrangement of programmable crossbars including two-terminal selectors and a configuration example of a programmable logic device (PLD) including a program control circuit.

For example, 2×2 computational units 11, 12, 21 and 22 include respective programmable crossbars. Each of the programmable crossbars includes 4×4 two-terminal resistance change elements. For example, a programmable crossbar 11 includes a horizontal-line group comprising four horizontal lines HL111, HL112, HL113 and HL114 and a vertical-line group comprising four vertical lines VL111, VL112, VL113 and VL114. At intersections of the horizontal-line group and the vertical-line group, two-terminal nonvolatile resistance change elements are provided.

A program control circuit comprises a horizontal-line group control circuit HL Control, a global horizontal-line group GHLij, a vertical-line group control circuit VL Control and a global vertical-line group GVLij, where i is 1 or 2, and j is one of 1, 2, 3 and 4. The program control circuit is shared among 2×2 computational units. For example, the programmable crossbar 11 and programmable crossbar 12 are connected to four global horizontal lines GHL11, GHL12, GHL13 and GHL14. Also, the programmable crossbar 11 and programmable crossbar 21 are connected to four global vertical lines GVL11, GVL12, GVL13 and GVL14.

The global horizontal lines and programmable crossbars are connected to each other or the global vertical lines and programmable crossbars are connected to each other, by two-terminal selectors.

Four horizontal lines HL111, HL112, HL113 and HL114 of the programmable crossbar 11 are connected to four global horizontal lines GHL11, GHL12, GHL13 and GHL14 by two-terminal selectors HS111, HS112, HS113 and HS114, respectively. Four horizontal lines HL121, HL122, HL123 and HL124 of the programmable crossbar 12 are connected to the four global horizontal lines GHL11, GHL12, GHL13 and GHL14 by two-terminal selectors HS121, HS122, HS123 and HS124, respectively.

Similarly, four vertical lines VL111, VL112, VL113 and VL114 of the programmable crossbar 11 are connected to four global vertical lines GVL11, GVL12, GVL13 and GVL14 by two-terminal selectors VS111, VS112, VS113 and VS114, respectively. Four vertical lines VL211, VL212, VL213 and VL214 of the programmable crossbar 21 are connected to four global vertical lines GVL11, GVL12, GVL13 and GVL14 by two-terminal selectors VS211, VS212, VS213 and VS214, respectively.

Each of the programmable crossbars is connected to a programmable logic resource in an associated computational unit, and also connected to the other computational units. These connections are omitted in FIG. 1.

Figure 2:
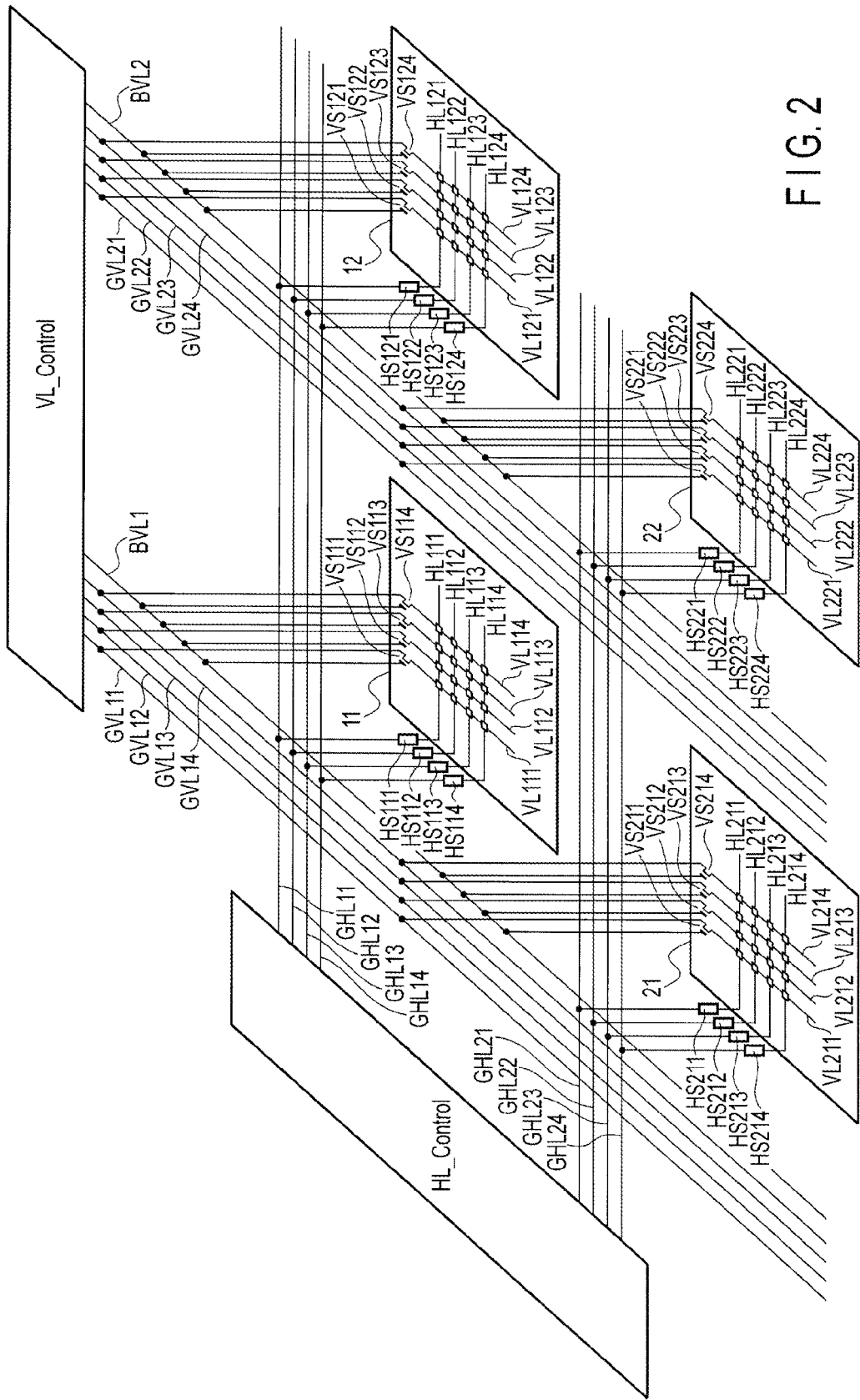
FIG. 2 is a view showing a second example of the reconfigurable circuit.

FIG. 2 shows an example of a modification of the arrangement of the programmable crossbars including two-terminal selectors and the configuration of the PLD including the program control circuit.

Unlike the example of FIG. 1, in the example of FIG. 2, global vertical lines GVLij and the programmable crossbars are connected to each other by three-terminal programming transistors. For example, four vertical lines VL111, VL112, VL113 and VL114 of the programmable crossbar 11 are connected to four global vertical lines GVL11, GVL12, GVL13 and GVL14 by three-terminal programming transistors VS111, VS112, VS113 and VS114, respectively.

The vertical-line group control circuit VL Control controls block vertical lines BVL1 and BVL2. Computational units arranged in the same column are connected to the same block vertical line. For example, in the programmable crossbar 11, gate terminals (control terminals) of three-terminal programming transistors VS111, VS112, VS113 and VS114 are connected to block vertical line BVL1. Also, in the programmable crossbar 21, gate terminals (control terminals) of three-terminal programming transistors VS211, VS212, VS213 and VS214 are connected to block vertical line BVL1.

Furthermore, in the programmable crossbar 12, gate terminals (control terminals) of three-terminal programming transistors VS121, VS122, VS123 and VS124 are connected to block vertical line BVL2. Also, in the programmable crossbar 22, gate terminals (control terminals) of three-terminal programming transistors VS221, VS222, VS223 and VS224 are connected to block vertical line BVL2.

Figure 3:
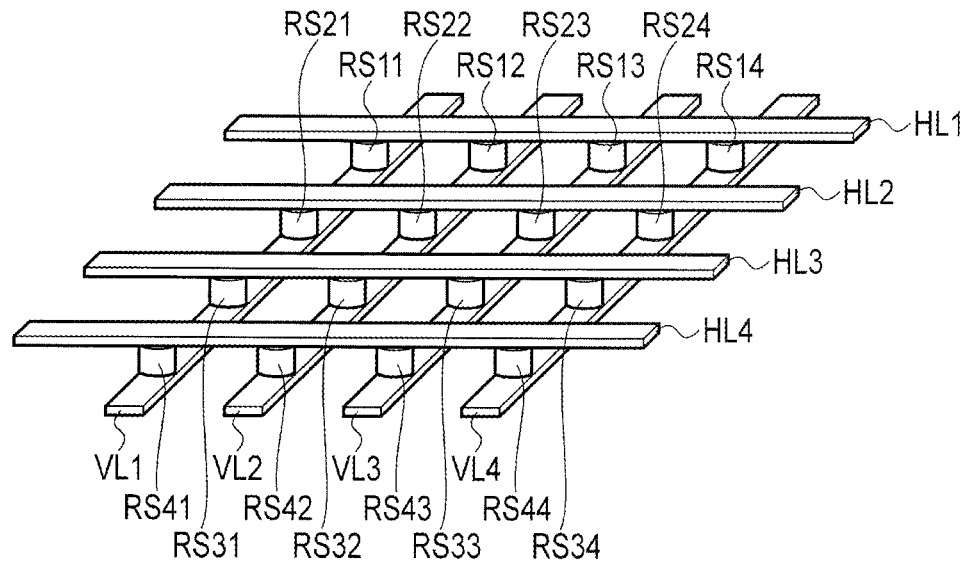
FIG. 3 is a view showing a configuration example of a programmable crossbar.
Figure 4:
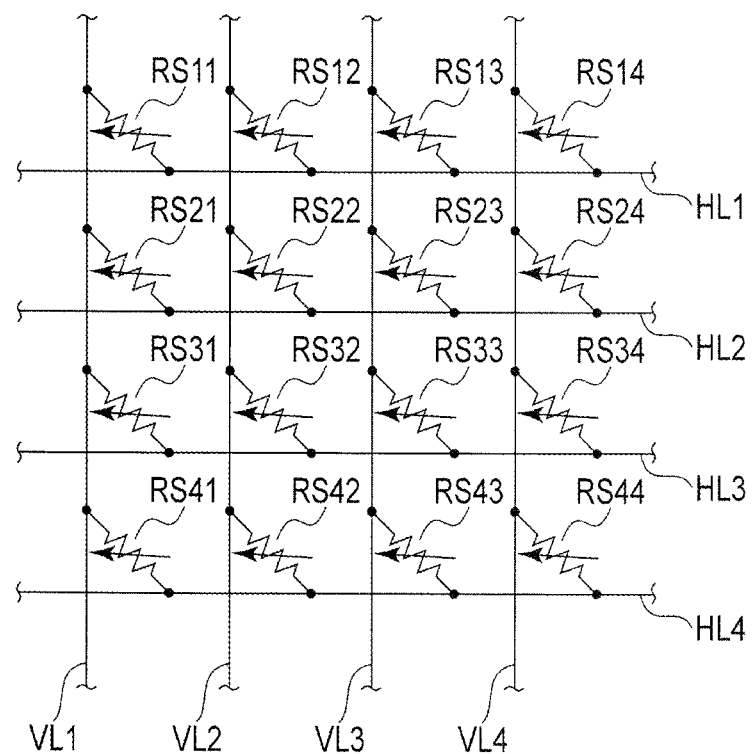
FIG. 4 is a view showing an equivalent circuit in the programmable crossbar as shown in FIG. 3.

FIG. 3 shows a configuration example of a programmable crossbar including two-terminal resistance change elements, which are located between writing layers. FIG. 4 shows an equivalent circuit in the programmable crossbar as shown in FIG. 3.

In this example, the programmable crossbar includes 4×4 two-terminal resistance change elements, and a horizontal-line group comprising four horizontal lines HL1, HL2, HL3 and HL4 and a vertical-line group comprising four vertical lines VL1, VL2, VL3 and VL4. At intersections of the vertical-line group and the horizontal-line group, two-terminal nonvolatile resistance change elements are provided. For example, at intersections of single horizontal line HL1 and four vertical lines VL1, VL2, VL3 and VL4, two-terminal nonvolatile resistance change elements RS11, RS12, RS13 and RS14 are provided. Thus, the programmable crossbar includes 4×4 two-terminal resistance change elements; that is, it includes 16 two-terminal resistance change elements.

FIG. 5 shows an example of a two-dimensional nonvolatile resistance change element. FIG. 6 shows an IV characteristic (current-voltage) characteristic of the nonvolatile resistance change element as shown in FIG. 5 where the nonvolatile resistance change element is unipolar. FIG. 7 shows the IV characteristic (current-voltage) characteristic of the nonvolatile resistance change element as shown in FIG. 5 where the nonvolatile resistance change element is bipolar.

In those figures, N1 and N2 are two terminals of the two-terminal nonvolatile resistance change element, V12 is the voltage of terminal N1 with respect to terminal N2, and I12 is current flowing from terminal N1 to terminal N2.

Also, suppose that the two-terminal nonvolatile resistance change element is initially in a high resistance state (HRS). In the HRS, since the resistance between terminals N1 and N2 is high, the two-terminal nonvolatile resistance change element interrupts a signal. Also, in the case where the two-terminal nonvolatile resistance change element is in the HRS, if a voltage pulse equal to or higher than voltage pulse $V_{set}$ is applied to the two-terminal nonvolatile resistance change element, the state thereof changes to a low resistance state (LRS). This will be referred to as a set operation. During the set operation, the program control circuit restricts maximum current amount Icomp. This is intended to set resistance value $R_{LRS}$ of the nonvolatile resistance change element which is in the LRS to a desired value, and also restrict the variance between resistance values $R_{LRS}$ of two-terminal nonvolatile resistance change elements.

In the LRS, since the resistance between terminals N1 and N2 is low, the two-terminal nonvolatile resistance change element transmits the signal. Also, in the case where the two-terminal nonvolatile resistance change element is in the LRS, if a voltage pulse equal to or higher than voltage pulse $V_{rst}$ is applied to the two-terminal nonvolatile resistance change element, the state thereof changes to the high resistance state (HRS). This will be referred to as a reset operation.

It should be noted that in the unipolar nonvolatile resistance change element as shown in FIG. 6, the set operation and the reset operation can be executed with voltage pulses of the same polarity; however, on the other hand, in the bipolar nonvolatile resistance change element as shown in FIG. 7, the set operation and the reset operation are executed with voltage pulses of different polarities.

Figure 10:
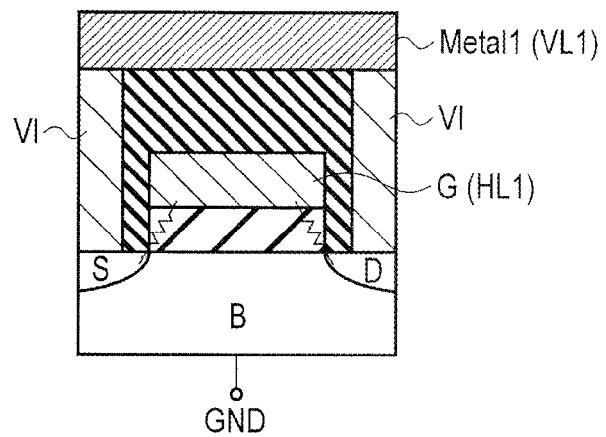
FIG. 10 is a cross-sectional view taken along line X-X' in FIG. 8.

FIG. 8 shows a configuration example of a programmable crossbar including resistance change elements on silicon. FIG. 9 shows an equivalent circuit in the programmable crossbar as shown in FIG. 8. FIG. 10 is a cross-sectional view taken along line X-X' in FIG. 8.

The resistance change element is a two-terminal resistance change element wherein of three terminals of a MOSFET, gate G is set as terminal N1, and short-circuited source S and drain D are set as terminal N2.

The MOSFET is formed in a well region on silicon, and the well region corresponds to body terminal B of the MOSFET. Body terminal B is shared among a plurality of adjacent MOSFETs. In this example, the programmable crossbar includes 4×4 two-terminal resistance change elements, and includes four a horizontal-line group comprising four horizontal lines HL1, HL2, HL3 and HL4 and a vertical-line group comprising four vertical lines VL1, VL2, VL3 and VL4. At intersections of the horizontal-line group and vertical-line group, resistance change elements are provided.

For example, at intersections of single horizontal line HL1 and four vertical lines VL1, VL2, VL3 and VL4, resistance change elements RS11, RS12, RS13 and RS14 are provided. Thus, the programmable crossbar includes 4×4 two-terminal resistance change elements on silicon; that is, it includes 16 resistance change elements on silicon. It should be noted that X is a region where a single resistance change element is provided.

As shown in FIGS. 8 and 10, for example, the horizontal-line group comprises a line-and-space pattern of polysilicon gates, and the vertical-line group comprises a line-and-space pattern of metal-1 lines. The metal-1 lines means first metal lines formed on silicon.

Also, a line-and-space pattern of silicon active areas AA is provided in parallel with the line-and-space pattern of metal-1 lines, and silicon active areas AA are arranged at the same pitch as the metal-1 lines. In addition, the metal-1 lines are connected to lines of silicon active areas AA by via contacts VI.

FIG. 10 shows a cross section of a resistance change element on silicon B. A polysilicon gate corresponding to gate G is terminal N1 of the resistance change element, and also forms horizontal line HL1. As shown in FIG. 10, via contacts VI of source S and drain D are connected to vertical line VL1 and a metal-1 line, and are short-circuited. Short-circuited source S and drain D serve as terminal N2 of the resistance change element. Silicon (well region) serving as body terminal B of a MOSFET is connected to ground potential (GND).

Figure 11:
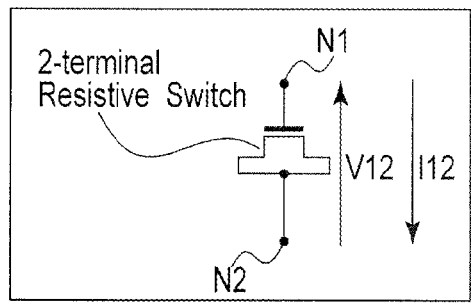
FIG. 11 is a view showing an example of another two-terminal resistance change element.
Figure 12:
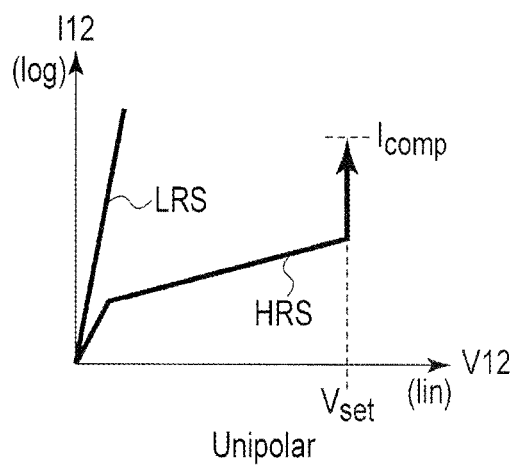
FIG. 12 is a view showing an IV characteristic of the resistance change element as shown in FIG. 11.

FIG. 11 shows an example of the nonvolatile resistance change element as shown in FIG. 10. FIG. 12 shows an IV (current-voltage) characteristic of the nonvolatile resistance change element as shown in FIG. 11.

Where gate G serves terminal N1, and short-circuited source S and drain D serve as terminal N2, as shown in FIG. 11, V12 is a voltage of terminal N1 with respect to terminal N2, and I12 is current flowing from terminal N1 to terminal N2 at this time.

In an initial state, terminals N1 and N2 are electrically disconnected from each other by a gate insulating film (e.g., oxide), and a region between terminals N1 and N2 is thus in the high resistance state (HRS). In the HRS, since the resistance between terminals N1 and N2 is high, the two-terminal resistance change element interrupts a signal. On the other hand, when voltage pulse $V_{set}$ equal to or higher than a breakdown voltage is applied between terminals N1 and N2, a breakdown occurs at an end portion of the gate insulating film. As a result, the state of the region between terminals N1 and N2 changes to the low resistance state (LRS). This will be referred to as a set operation. During the set operation, the program control circuit restricts maximum current amount Icomp. This is intended to set resistance value $R_{LRS}$ of the two-terminal resistance change element which is in the low resistance state (LRS) to a desired value, and also to restrict the variance between resistance values $R_{LRS}$ of two-terminal resistance change elements.

FIG. 13 shows a configuration example of a computational unit.

To be more specific, a computational unit 1 comprises a programmable crossbar 2 and a programmable logic 3. The programmable logic 3 comprises a k-input look-up table LUT, a flip-flop FF for configuration of a sequential circuit, and a two-input, single output multiplexer MUX. The k-input LUT can include an arbitrary truth table having k inputs and a single output. The multiplexer MUX selects one of an output of the k-input LUT and an output of the flip-flop FF, and outputs it.

The programmable crossbar 2 includes m×n 4 two-terminal resistance change elements, and m horizontal lines HL1 to HLm and n vertical lines VL1 to VLn. Also, horizontal lines HL1 to HLm are connected to output terminals OUT1 to OUTm of the programmable crossbar 2, respectively. In this case, horizontal lines HL1 to HLm are connected to output terminals OUT1 to OUTm through cutoff transistors HC1 to HCm and output inverters OUT Inv1 to OUT Invm, respectively. Horizontal lines HL1 to HLm are also connected to global horizontal lines GHL1 to GHLm through two-terminal selectors HS1 to HSm, respectively.

Vertical lines VL1 to VLn are connected to input terminals IN1 to Inn of the programmable crossbar 2, respectively. In this case, vertical lines VL1 to VLn are connected to input terminals IN1 to INn through cutoff transistors VC1 to VCn and input inverters IN_Inv1 to IN_Invn, respectively. Vertical lines VL1 to VLn are also connected to global vertical lines GVL1 to GVLn through two-terminal selectors VS1 to VSn. Cutoff transistors HC1 to HCm and VC1 to VCn are provided to prevent the output or input inverters from being broken by a set/reset pulse during the set/reset operation. To be more specific, it is possible to prevent the set/reset pulse from being supplied to the output or input inverters, by turning off cutoff transistors HC1 to HCm and VC1 to VCn during the set/reset operation.

Alternatively, it is possible to reduce a voltage to be applied to the output or input inverters, by applying a pulse voltage equal to or less than a set/reset voltage to gates of cutoff transistors HC1 to HCm and VC1 to VCn. It should be noted that it is possible to pass an internal signal by turning on cutoff transistors HC1 to HCm and VC1 to VCn during a PLD operation.

Input terminals IN1 to INn of the programmable crossbar 2 of a computational unit are connected to output terminals of the programmable logic 3 of the computational unit or output terminals of another programmable crossbar 2. On the other hand, output terminals OUT1 to OUTm of the programmable crossbar 2 of the computational unit are connected to input terminals of the programmable logic 3 of the computational unit or input terminals of another programmable crossbar 2.

One of features of this embodiment resides in that lines provided between programmable crossbars 2 and lines provided between a programmable crossbar 2 and a programmable logic 3 of each computational unit are unidirectional lines, and in each programmable crossbar 2, horizontal lines HL1 to HLm are connected to output terminals OUT1 to OUTm only, and vertical lines VL1 to VLn are connected to input terminals IN1 to INn only. This rule will be hereinafter referred to as a unidirectional rule.

Figure 14:
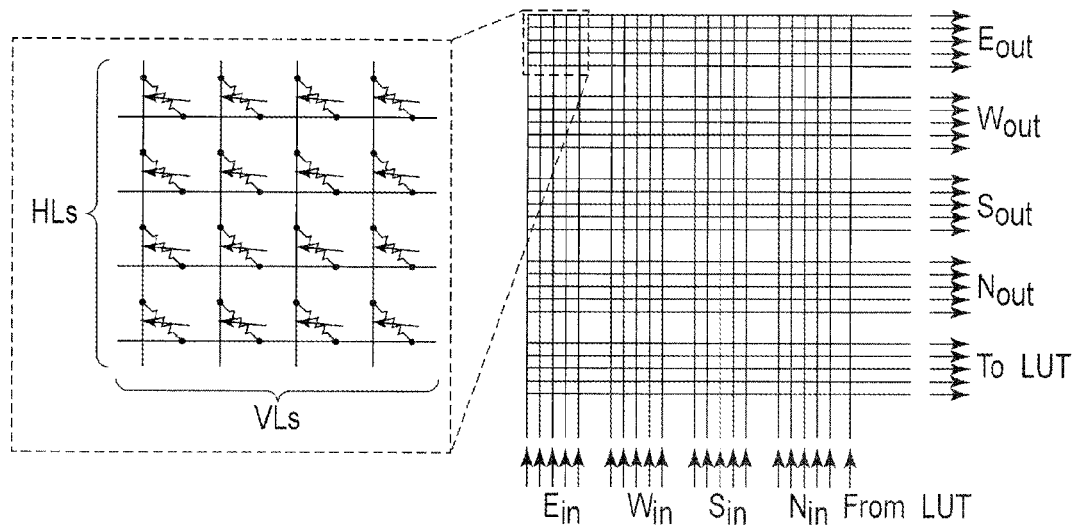
FIG. 14 is a view showing a configuration example of a still another programmable crossbar.

FIG. 14 shows a configuration example of a programmable crossbar which satisfies the unidirectional rule.

In this example, each computational unit is connected only to four computational units which are adjacent to it in four directions, respectively, i.e., on its both sides in a horizontal direction and on its both sides in a vertical direction. The total number of lines provided between any two adjacent computational units is eight; that is, four input lines and four output lines are provided between any two adjacent computational units. To be more specific, the output lines of one of any two adjacent computational units are connected to input terminals connected to vertical lines VLs of the other computational unit. On the other hand, output terminals connected to horizontal lines HLs connected to the above other computational unit are connected to input lines of the above one of any two adjacent computational units.

A computational unit which satisfies the unidirectional rule is featured in that with respect to a plurality of resistance change elements connected to one of horizontal lines HLs, the number of resistance change elements which enter the low resistance state is one or zero.

With respect to an interconnection between programmable logics, although there is a case where a single input signal is output from a plurality of output terminals, in no case will a plurality of input signals be output from a single output terminal. For example, in a programmable crossbar, in the case of connecting j-th input terminal INj and i-th output terminal OUTi to each other, of resistance change elements RSi1 to RSin connected to i-th horizontal line HLi, only j-th resistance change element RSij is made to enter the low resistance state, and the other resistance change elements, i.e., an (n−1) number of resistance change elements, are made to enter the high resistance state. None of the input terminals other than j-th input terminal INj are connected to i-th output terminal OUTi.

In order to reconfigure a PLD, for example, in the case of connecting k-th input terminal INk and i-th output terminal OUTi to each other, first, resistance change element RSij is made to enter the high resistance state (j-th input terminal INj is disconnected from i-th output terminal OUTi), and then resistance change element RSik is made to enter the low resistance state (k-th input terminal Ink is connected to i-th output terminal OUTi).

As described above, a computational unit satisfying the unidirectional rule is featured in that with respect to a plurality of resistance change elements connected to one of the horizontal lines HLs, the number of resistance change elements which enter the low resistance state is one or zero. This feature means that during the set/reset operation, in the computational unit, no sneak current path exits. Therefore, the circuit configuration and set/reset procedure can be simplified, and the entire circuit area can be made smaller.

A nonlinear resistor, for example, a diode, is defined as a resistor which does not conform to Ohm's law (R=V/I), and is characterized in that its resistance value varies in accordance with an applied voltage. A rectification nonlinear resistor whose resistance value varies in accordance with the polarity of an applied voltage can be used as a unipolar two-terminal selector. A bipolar nonlinear resistor whose resistance value becomes high when an applied voltage is low and whose resistance value becomes low when the applied voltage is high can be used as a bipolar two-terminal selector.

Figure 15:
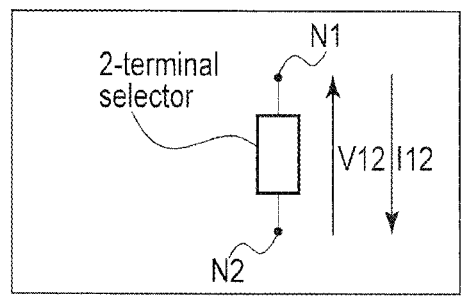
FIG. 15 is a view showing an example of still another two-terminal resistance change element.

FIG. 15 shows an example of a nonlinear resistor which can be used as a two-terminal selector.

In the following explanation and the figures, N1 and N2 are two terminals of a two-terminal nonlinear resistor, V12 is a voltage of terminal N1 with respect to terminal N2, and 112 is current flowing from terminal N1 to terminal N2 in this case.

Figure 16:
FIG. 16 is a view showing an equivalent circuit in the element as shown in FIG. 15 where the element as shown in FIG. 15 is unipolar.
Figure 17:
FIG. 17 is a view showing an equivalent circuit provided in the case where the element as shown in FIG. 15 is bipolar.
Figure 18:
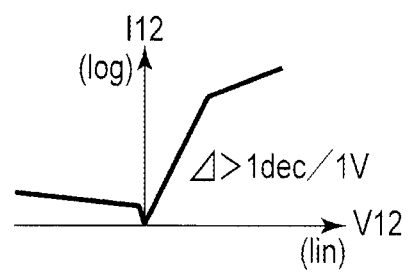
FIG. 18 is a view showing an IV characteristic of the element as shown in FIG. 15 where the element as shown in FIG. 15 is unipolar.
Figure 19:
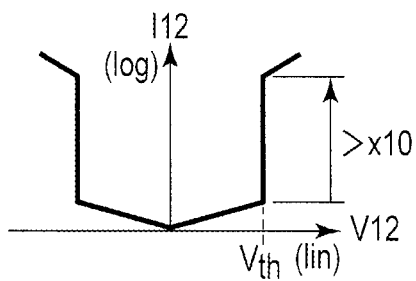
FIG. 19 is a view showing an IV characteristic of the element as shown in FIG. 15 where the element as shown in FIG. 15 is bipolar.
Figure 20:
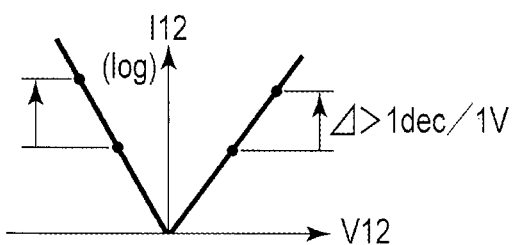
FIG. 20 is a view showing another IV characteristic of the element as shown in FIG. 15 where the element as shown in FIG. 15 is bipolar.

FIG. 16 shows an equivalent circuit of the two-terminal selector as shown in FIG. 15 where the two-terminal selector as shown in FIG. 15 is unipolar, and FIG. 17 shows an equivalent circuit of the two-terminal selector as shown in FIG. 15 where the two-terminal selector as shown in FIG. 15 is bipolar. FIG. 18 shows an IV characteristic of a unipolar rectification nonlinear resistor which is obtained by making the nonlinear resistor as shown in FIG. 15 unipolar as shown in FIG. 16. FIG. 19 shows an IV characteristic of a threshold switching type nonlinear resistor which is obtained by making the nonlinear resistor as shown in FIG. 15 bipolar as shown in FIG. 17. FIG. 20 shows an IV characteristic of a bipolar nonlinear resistor which is obtained by making the nonlinear resistor as shown in FIG. 15 bipolar as shown in FIG. 17.

With respect to the IV characteristic of the rectification nonlinear resistor as shown in FIG. 18, a resistance value which the nonlinear resistor has when positive voltage V12 is applied is smaller than a resistance value which the nonlinear resistor has when negative voltage V12 is applied. Application of positive voltage V12 will be referred to as a forward voltage application. It should be noted that it is preferable that the rectification nonlinear resistor have a resistance change rate (>1 decade/V) such that its resistance value is decreased by 10 times or more when positive voltage V12 is increased by 1V.

Such a rectification nonlinear resistor is achieved by a PN junction of a semiconductor, a PN junction of an oxide semiconductor, a heterojunction of two kinds of oxides having different work functions, a metal/insulator type schottky connection, metal/solid electrolyte interface, or the like.

A threshold switching type nonlinear resistor as shown in FIG. 19 is featured in that a resistance value which the nonlinear resistor has when a voltage higher than a threshold voltage Vth is applied is at least 10 times or more smaller than a resistance value which the nonlinear resistor has when a voltage lower than the threshold voltage Vth is applied.

A bipolar nonlinear resistor as shown in FIG. 20 is featured in that it has a resistance change rate such that its resistance value is decreased by 10 times or more when positive voltage V12 is increased by 1V, and its resistance value is decreased by 10 times or more when negative voltage V12 is decreased by 1V.

Such a threshold switching type nonlinear resistor and a bipolar nonlinear resistor can be achieved by applying the following structure: for example, a metal-insulator-Metal (MIM) type laminate structure, a structure in which metal-insulator transition material such as VO2 is sandwiched between metals, or a metal/solid electrolyte/metal structure.

A configuration example of the PLD, a program operation method for the PLD and a PLD operation method will be explained with reference to FIG. 21 to FIG. 32. The explanation is given with respect to the program operation and the PLD operation on resistance change elements in the case where 2×2 computational units are provided as in the case shown in FIGS. 1 and 2. Furthermore, suppose a selected resistance change element (RS-set) to be subjected to the set/reset operation is also a resistance change element provided between horizontal line HL112 and vertical line VL112 in the computational unit 11.

Horizontal line HL112 is connected to global horizontal line GHL12 by selector HS112. Vertical VL112 is connected to global vertical line GVL12 by selector VS112. The states of unselected selectors and unselected resistance change elements located in the same row as selected resistance change element RS-sel and in different columns from the column in which selected resistance change element RS-sel is located or the states of unselected selectors and unselected resistance change elements located in different rows from the row in which selected resistance change element RS-sel is located and in the same column as selected resistance change element RS-sel will be referred to semi-selected states.

Furthermore, suppose in the computational unit 12 adjacent to the computational unit 11, resistance change elements provided at intersections of horizontal lines HL122 and vertical lines VL122 are in the low resistance state LRS. Similarly, suppose in the computational unit 21 adjacent to the computational unit 11, resistance change elements provided at intersections of horizontal lines HL212 and vertical lines VL212 are also in the low resistance state LRS.

FIGS. 21 to 23 show a configuration example of a reconfigurable circuit obtained by applying unipolar two-terminal selectors and unipolar two-terminal resistance change elements to the configuration example of the PLD as shown in FIG. 1, and a program operation method and a PLD operation method for the obtained reconfigurable circuit.

In the set operation, set voltage $V_{set}$ (e.g., 3V) is applied to selected global horizontal line GHL12, and set voltage $V_{set}/2$ is applied to unselected global horizontal lines. Also, ground potential GND is applied to selected global vertical line VHL12, and set voltage $V_{set}/2$ is applied to unselected global vertical lines.

In this case, a high voltage close to set voltage $V_{set}$ is applied to selected resistance change element RS-sel. As a result, selected resistance change element RS-sel enters the low resistance state LRS. To selectors HS112 and VS112 connected to selected resistance change element RS-sel, a forward voltage is applied. Therefore, the set operation of selected resistance change element RS-sel is not interrupted. On the other hand, the resistance change elements which are in the semi-selected state do not change to enter the low resistance state LRS, since the voltage applied to those resistance change elements is lower than set voltage $V_{set}/2$.

Furthermore, to the selectors which are in the semi-selected state, a forward voltage is applied. However, the voltage has a small value, which is less than that of set voltage $V_{set}/2$, and thus the selectors enter the high resistance state. Selectors HS122 and VS122 which are in the semi-selected state, prevent large current from flowing through resistance change element RS122 which is in the low resistance state and the semi-selected state. It is therefore possible to prevent lowering of set voltage $V_{set}$ to be applied to selected resistance change element RS-sel.

In the reset operation, reset voltage $V_{rst}$ (e.g., 2V) is applied to selected global horizontal line GHL12, and reset voltage $V_{rst}/2$ is applied to unselected global horizontal lines. Also, ground potential GND is applied to selected global vertical lines GVL12, and reset voltage $V_{rst}/2$ is applied to unselected global vertical lines.

To selected resistance change element RS-sel, a high voltage close to reset voltage $V_{rst}$ is applied. Thus, selected resistance change element RS-sel enters the high resistance state HRS. To selectors HS112 and VS112 connected to selected resistance change element RS-sel, a forward voltage is applied. Thus, the reset operation of selected resistance change element RS-sel is not interrupted.

On the other hand, the resistance change elements being in the semi-selected state do not change to enter the high resistance state HRS, since the voltage applied to those resistance change elements is lower than reset voltage $V_{rst}/2$. Also, to the selectors being in the semi-selected state, a forward voltage is applied. However, since the voltage has a small value, which is less than reset voltage $V_{rst}/2$, the selectors enter the high resistance state. Selectors HS122 and VS122 being in the semi-selected state prevent large current from flowing through resistance change element RS 122 being in the low resistance state LRS. It is therefore possible to prevent lowering of reset voltage $V_{rst}$ to be applied to selected resistance change element RS-sel.

In the PLD operation, ground potential GND is applied to all global horizontal lines GHL, and operating voltage Vcc (e.g., 1V) of the PLD is applied to all global vertical lines GVL.

During the PLD operation, the voltage applied to the horizontal lines HL and the vertical lines VL of a programmable crossbar is equal in value to Vss (e.g., 0V) at the minimum and operating voltage Vcc at the maximum. Therefore, to all the selectors HS and VS, a reverse voltage is applied. Therefore, the programmable crossbars, the global horizontal lines and the vertical lines are electrically disconnected from each other.

Figure 24:
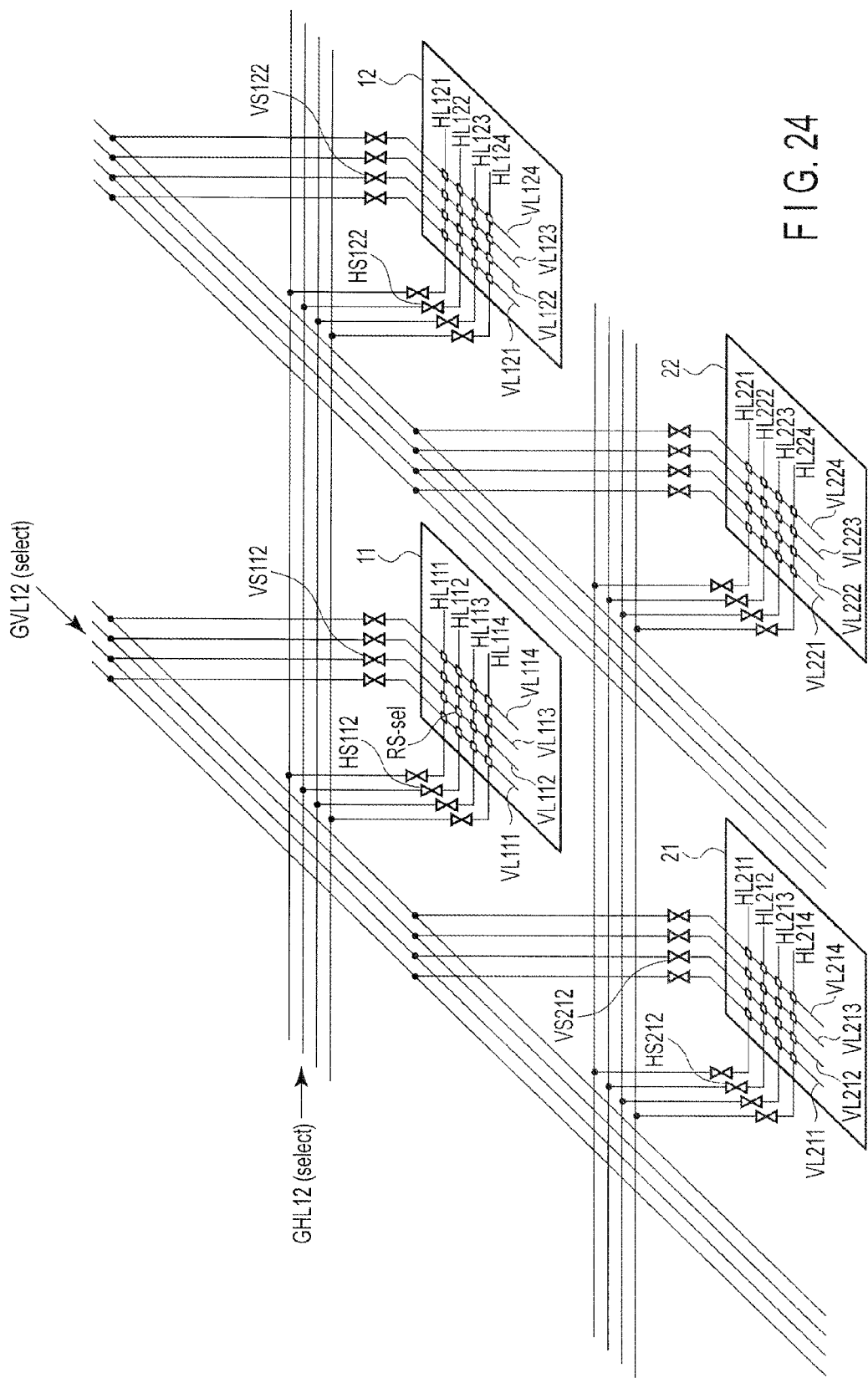
FIG. 24 is a view showing an application example of another reconfigurable circuit.

FIGS. 24 to 26 show a configuration example of a reconfigurable circuit obtained by applying bipolar two-terminal selectors and bipolar two-terminal resistance change elements to the configuration example of the PLD as shown in FIG. 1, and a program operation method and a PLD operation method for the above obtained reconfigurable circuit.

In the set operation, set voltage $V_{set}$ (e.g., 3V) is applied to selected global horizontal lines GHL12, and set voltage $V_{set}/2$ is applied to the unselected global horizontal lines. Also, ground potential GND is applied to selected global vertical line VHL12, and set voltage $V_{set}/2$ is applied to the unselected global vertical lines.

In this case, to selected resistance change element RS-sel, a high positive voltage close to set voltage $V_{set}$ is applied. Thus, selected resistance change element RS-sel enters the low resistance state LRS. To selectors HS112 and VS112 connected to selected resistance change element RS-sel, a high voltage is transiently applied. However, each time such a high voltage is applied, the selectors enter the low resistance state and thus do not interrupt the set operation of selected resistance change element RS-sel.

On the other hand, the resistance change elements being in the semi-selected state do not change to enter the low resistance state LRS, since the voltage applied to the resistance change elements is lower than set voltage $V_{set}/2$. Also, the selectors being in the semi-selected state enter the high resistance state, since the voltage applied to the selectors is lower than set voltage $V_{set}/2$. Selectors HS122 and VS122 being in the semi-selected state prevent large current from flowing through unselected resistance change element RS122 which is in the low resistance state and the semi-selected state. It is therefore possible to prevent lowering of set voltage $V_{set}$ to be applied to selected resistance change element RS-sel.

In the reset operation, ground potential GND is applied to selected global horizontal line GHL12, and a reset voltage (e.g., 2V) which is ½ of reset voltage $V_{rst}$ is the unselected global horizontal lines. Also, reset voltage $V_{rst}$ is applied to selected global vertical lines GVL12, and reset voltage $V_{rst}/2$ is applied to the unselected global vertical lines.

To selected resistance change element RS-sel, a high negative voltage close to voltage $V_{rst}$ is applied. Thus, selected resistance change element RS-sel enters the high resistance state HRS. To selectors HS112 and VS112 connected to selected resistance change element RS-sel, a high voltage is transiently applied. However, each time such a high voltage is applied, the selectors enter the low resistance state, and thus do not interrupt the reset operation of selected resistance change element RS-sel.

On the other hand, the resistance change elements being in the semi-selected state do not change to enter the high resistance state HRS, since the voltage applied to the resistance change elements are lower than reset voltage $V_{rst}/2$. Also, the selectors being in the semi-selected state enter the high resistance state, since the voltage applied to the selectors is lower than the reset voltage $V_{rst}/2$. Selectors HS212 and VS212 being in the semi-selected state prevents large current from flowing through resistance change element RS122 which is in the semi-selected state and in the low resistance state LRS. It is therefore possible to prevent lowering of reset voltage $V_{rst}$ to be applied to selected resistance change element RS-sel.

In the PLD operation, to all the global horizontal lines GHL and all the global vertical lines GVL, a voltage (e.g., 0.5V) which is ½ of operating voltage Vcc of the PLD is applied.

During the PLD operation, the voltage applied to the horizontal lines HL and the vertical lines VL of a programmable crossbar is equal in value to the operating voltage Vcc at the maximum and Vss (GND) at the minimum. Therefore, the voltage applied to all the selectors (selectors HS and VS) is lower than ½ of the operating voltage (Vcc/2), and thus the selectors enter the high resistance state. Thus, the programmable crossbar is electrically disconnected from the global horizontal lines and vertical lines.

FIGS. 27 to 29 show a configuration example of a reconfigurable circuit obtained by applying unipolar two-terminal selectors and unipolar two-terminal resistance change elements to the configuration example of the PLD as shown in FIG. 2, and a program operation method and a PLD operation method for the above obtained reconfiguration circuit.

In the set operation, set voltage $V_{set}$ (for example, 3V) is applied to selected global horizontal line GHL12, and set voltage $V_{set}/2$ is applied to the unselected global horizontal lines. Also, an on-voltage (for example, 3V) which is equal to or higher than a threshold voltage of each of the programming transistors is applied to selected block vertical line BVL1, and off voltage $V_{off}$ (for example, 0V) which is lower than the threshold voltage of each programming transistor is applied to unselected block vertical line BVL2. Furthermore, ground potential GND is applied to selected global vertical line VHL12, and the set voltage $V_{set}/2$ is applied to the other global vertical lines.

In this case, a high voltage close to set voltage $V_{set}$ is applied to selected resistance change element RS-sel. Thus, selected resistance change element RS-sel enters the low resistance state LRS. Selector HS112 connected to selected resistance change element RS-sel and programming transistor VS112 also connected to selected resistance change element RS-sel do not interrupt the set operation of selected resistance change element RS-sel, since forward voltage is applied to selected resistance change element RS-sel, and programming transistor VS112 is in the on state.

On the other hand, the resistance change elements being in the semi-selected state in a selected block (computational unit) 11 do not change to enter the low resistance state LRS, since the voltage applied to the resistance change elements is lower than set voltage $V_{set}/2$. In unselected blocks (computational units) 21 and 22, since the programming transistors enter the off state, the programmable crossbar is electrically disconnected from the global vertical lines.

In the reset operation, reset voltage $V_{rst}$ (for example, 2V) is applied to selected global horizontal line GHL12, and reset voltage $V_{rst}/2$ is applied to the unselected global horizontal lines. Also, on-voltage $V_{on}$ (for example, 3V) which is equal to or higher than the threshold voltage of each of the programming transistors is applied to selected block vertical line BVL1, and off-voltage $V_{off}$ (for example, 0V) which is lower than the threshold voltage of each of the programming transistors is applied to unselected block vertical line BVL2. Furthermore, ground potential GND is applied to selected global vertical lines GVL12, and reset voltage $V_{rst}/2$ is applied to the other unselected global vertical lines.

To selected resistance change element RS-sel, a high voltage close to reset voltage $V_{rst}$ is applied. Thus, selected resistance change element RS-sel enters the high resistance state HRS. Also, to selector HS112 connected to selected resistance change element RS-sel, a forward voltage is applied; and programming transistor VS112 connected to selected resistance change element RS-sel is turned on. Thus, selector HS112 and programming transistor VS112 do not interrupt the reset operation of selected resistance change element RS-sel.

On the other hand, the resistance change elements being in the semi-selected state in the selected block (computational unit) 11 do not change to enter the high resistance state HRS, since the voltage applied to the resistance change elements is lower than reset voltage $V_{rst}/2$. In unselected blocks (computational units) 12 and 22, the programming transistors are turned off, and thus the programmable crossbars and the global vertical lines are electrically disconnected from each other.

In the PLD operation, ground potential GND is applied to all the global horizontal lines GHL, and all the global vertical lines GVL are made in a floating state (high impedance state). Also, to all the block vertical lines BVL, an off voltage $V_{off}$ is applied.

In the PLD operation, the voltage applied to the horizontal lines of a programmable crossbar is equal in to operating voltage Vcc at the maximum and ground potential GND at the minimum, and thus to all the selectors HS, a reverse voltage is applied. Also, all the programming transistors are in the off state. Therefore, the programmable crossbar and the global horizontal lines and vertical lines are electrically disconnected from each other.

FIGS. 30 to 32 show a further configuration example of the reconfigurable circuit obtained by applying bipolar two-terminal selectors and bipolar two-dimensional resistance change elements to the configuration example of the PLD as shown in FIG. 2, and a program operation method and a PLD operation method for the reconfiguration circuit.

In the set operation, set voltage $V_{set}$ (for example, 3V) is applied to selected global horizontal lines GHL12, and set voltage $V_{set}/2$ is applied to the unselected global horizontal lines. Also, on-voltage $V_{on}$ (for example, 3V) higher than the threshold voltage of each of the programming transistors is applied to selected block vertical line BVL1, and off-voltage $V_{off}$ (for example, 0V) less than the threshold voltage of each of the programming transistors is applied to unselected block vertical line BVL2. Furthermore, ground potential GND is applied to selected to selected global vertical line VHL12, and set voltage $V_{set}/2$ is applied to the unselected global vertical lines.

In this case, a high voltage close to the set voltage $V_{set}$ is applied to selected resistance change element RS-sel. Thus, selected resistance change element RS-set enters the low resistance state LRS. To selector HS112 connected to selected resistance change element RS-sel, a high voltage is transiently applied; however, since selector HS112 enters the low resistance state each time a high voltage is applied to it, and programming transistor VS112 connected to selected resistance change element RS-sel is turned on, selector HS112 and programming transistor VS112 do not interrupt the set operation of selected resistance change element RS-sel.

On the other hand, the resistance change elements being in the semi-selected state in the selected block (computational unit) 11 does not change to enter the low resistance state LRS, since the voltage applied to the resistance change elements is lower than set voltage $V_{set}/2$. In unselected block (computational units) 12 and 22, since the programming transistors are turned off, the programmable crossbar and the global vertical lines are electrically disconnected from each other.

In the reset operation, ground potential GND is applied to selected global horizontal line GHL12, and a voltage which is ½ of reset voltage $V_{rst}$ (for example, 2V) is applied to the unselected global horizontal lines. Furthermore, on-voltage $V_{on}$ (for example, 3V) equal to or higher than the threshold voltage of each of the programming transistors is applied to selected block vertical line BVL1, and off-voltage $V_{off}$ (for example, 0V) less than the threshold voltage of each of the programming transistors is applied to unselected block vertical line BVL2. Furthermore, reset voltage $V_{rst}$ is applied to selected global vertical line GVL12, and reset voltage $V_{rst}/2$ is applied to the unselected global vertical lines.

To selected resistance change element RS-sel, a high negative voltage close to reset voltage $V_{rst}$. Thus, selected resistance change element RS-sel enters the high resistance state HRS. To selector HS112 connected to selected resistance change element RS-sel, a high voltage is transiently applied; however, since selector HS112 enters the low resistance state each time a high voltage is applied to selector HS112, and programming transistor VS112 connected to selected resistance change element RS-sel is turned on, selector HS112 and resistance change element RS-sel do not interrupt the reset operation of selected resistance change element RS-sel.

On the other hand, the resistance change elements being in the semi-selected state in the selected block (computational unit) 11 do not change to enter the high resistance state HRS, since the voltage applied to the resistance change element is lower than the reset voltage $V_{rst}/2$. In unselected blocks (computational units) 11 and 12, the programming transistors are turned off, and thus the programmable crossbar and the global vertical lines are electrically disconnected from each other.

In the PLD operation, voltage Vcc/2 which is ½ of operating voltage Vcc is applied to all the global horizontal lines GHL, and all the global vertical lines GVL are made in the floating state (high impedance state). Also, off voltage $V_{off}$ is applied to all the block vertical lines BVL.

In the PLD operation, the voltage applied to the horizontal lines HL in the programmable crossbar is equal in value to operating voltage Vcc at the maximum and ground potential GND at the minimum. Thus, the voltage applied to all the selectors HS is equal to or lower than voltage Vcc/2, and all the selectors HS enter the high resistance state. Also, all the programming transistors are turned off. Therefore, the programmable crossbar and the global horizontal lines and vertical lines are electrically disconnected from each other.

In such a manner, according to the embodiment, it is possible to achieve arrangement of programmable crossbars incorporating selectors with a smaller footprint, and provide a program control circuit including the programmable crossbars, and a program operation method and a PLD operation method for the program control circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reconfigurable circuit comprising:
   first, second, third and fourth circuit blocks arranged with a matrix;
   a first conductive line shared by the first and second circuit blocks;
   a second conductive line shared by the third and fourth circuit blocks;
   a third conductive line shared by the first and third circuit blocks, the third conductive line crossing the first and second conductive lines;
   a fourth conductive line shared by the second and fourth circuit blocks, the fourth conductive line crossing the first and second conductive lines;
   a first controller controlling voltages to be applied to the first and second conductive lines; and
   a second controller controlling voltages to be applied to the third and fourth conductive lines,
   wherein each of the first, second, third and fourth circuit blocks comprises:
   a fifth conductive line;
   a sixth conductive line crossing the fifth conductive line;
   a resistance change element including first and second terminals, the first terminal being connected to the fifth conductive line, the second terminal being connected to the sixth conductive line;
   a first selecting element including first and second terminals as a current path, the first terminal being connected to the fifth conductive line; and
   a second selecting element including first and second terminals as a current path, the first terminal being connected to the sixth conductive line,
   wherein the second terminal of the first selecting element in the first circuit block is connected to the first conductive line, and the second terminal of the second selecting element in the first circuit block is connected to the third conductive line,
   wherein the second terminal of the first selecting element in the second circuit block is connected to the first conductive line, and the second terminal of the second selecting element in the second circuit block is connected to the fourth conductive line,
   wherein the second terminal of the first selecting element in the third circuit block is connected to the second conductive line, and the second terminal of the second selecting element in the third circuit block is connected to the third conductive line,
   wherein the second terminal of the first selecting element in the fourth circuit block is connected to the second conductive line, and the second terminal of the second selecting element in the fourth circuit block is connected to the fourth conductive line,
   wherein one of the first and second selecting elements is a nonlinear resistance element, and the other of the first and second selecting elements is a nonlinear resistance element or a transistor.

2. The circuit of claim 1, wherein
   the resistance change element in the first circuit block is switchable from a first resistance state to a second resistance state by a voltage applied between the first and third conductive lines.

3. The circuit of claim 1, wherein
   the nonlinear resistance element is a diode.

4. The circuit of claim 1, wherein
   the transistor has a control terminal different from the first and second terminals, the control terminal being connected to a conductive line.

5. The circuit of claim 1, wherein
   the first circuit block includes a programmable logic circuit having input and output terminals, the input terminal being connected to the fifth conductive line in the first circuit block, and the output terminal being connected to the sixth conductive line in the first circuit block.

6. The circuit of claim 1, wherein
   the first circuit block includes an inverter having input and output terminals, the input terminal being connected to the fifth conductive line in the first circuit block.

7. The circuit of claim 1, wherein
   the first circuit block includes an inverter having input and output terminals, the output terminal being connected to the sixth conductive line in the first circuit block.

8. The circuit of claim 1, wherein
   the first circuit block includes resistance change elements connected to the fifth conductive line in the first circuit block, a number of the resistance change elements which are in a low resistance state is one or zero.

9. The circuit of claim 1, wherein
   a resistance value of the nonlinear resistance element when a positive first voltage is applied to the first terminal of the nonlinear resistance element with respect to the second terminal thereof is smaller than a resistance value of the nonlinear resistance element when a negative first voltage is applied to the first terminal of the nonlinear resistance element with respect to the second terminal thereof.

10. The circuit of claim 1, wherein
    a resistance value of the nonlinear resistance element when a positive first voltage is applied to the first terminal of the nonlinear resistance element with respect to the second terminal thereof is smaller than a resistance value of the nonlinear resistance element when a negative first voltage is applied to the first terminal of the nonlinear resistance element with respect to the second terminal thereof; and
    a resistance value of the nonlinear resistance element when a positive second voltage is applied to the first terminal of the nonlinear resistance element with respect to the second terminal thereof is at least 10 times smaller than a resistance value of the nonlinear resistance element when a positive third voltage which is lower than the second voltage by 1V is applied to the first terminal of the nonlinear resistance element with respect to the second terminal thereof.

11. The circuit of claim 1, wherein
    a resistance value of the nonlinear resistance element when a voltage higher than a threshold voltage is applied between the first terminal and second terminal of the nonlinear resistance element is at least 10 times smaller than a resistance value of the nonlinear resistance element when a voltage lower than the threshold voltage is applied between the first terminal and the second terminal of the nonlinear resistance element.

12. The circuit of claim 1, wherein
    a resistance value of the nonlinear resistance element when a positive first voltage is applied to the first terminal of the nonlinear resistance element with respect to the second terminal thereof is at least 10 times smaller than a resistance value of the nonlinear resistance element when a positive second voltage which is lower than the first voltage by 1V is applied to the first terminal of the nonlinear resistance element with respect to the second terminal thereof; and a resistance value of the nonlinear resistance element when a negative third voltage is applied to the first terminal of the nonlinear resistance element with respect to the second terminal thereof is at least 10 times smaller than a resistance value of the nonlinear resistance element when a negative fourth voltage which is higher than the third voltage by 1V is applied to the first terminal of the nonlinear resistance element with respect to the second terminal thereof.

13. A reconfigurable circuit comprising:

first, second, third and fourth circuit blocks arranged with a matrix;

a first conductive line shared by the first and second circuit blocks;

a second conductive line shared by the third and fourth circuit blocks;

a third conductive line shared by the first and third circuit blocks, the third conductive line crossing the first and second conductive lines;

a fourth conductive line shared by the second and fourth circuit blocks, the fourth conductive line crossing the first and second conductive lines;

a first controller controlling voltages to be applied to the first and second conductive lines; and a second controller controlling voltages to be applied to the third and fourth conductive lines, wherein each of the first, second, third and fourth circuit blocks comprises:

a fifth conductive line;

a sixth conductive line crossing the fifth conductive line;

a resistance change element including first and second terminals, the first terminal being connected to the fifth conductive line, the second terminal being connected to the sixth conductive line;

a first nonlinear resistance element including first and second terminals as a current path, the first terminal being connected to the fifth conductive line; and a second nonlinear resistance element including first and second terminals as a current path, the first terminal being connected to the sixth conductive line, wherein the second terminal of the first nonlinear resistance element in the first circuit block is connected to the first conductive line, and the second terminal of the second nonlinear resistance element in the first circuit block is connected to the third conductive line, wherein the second terminal of the first nonlinear resistance element in the second circuit block is connected to the first conductive line, and the second terminal of the second nonlinear resistance element in the second circuit block is connected to the fourth conductive line, wherein the second terminal of the first nonlinear resistance element in the third circuit block is connected to the second conductive line, and the second terminal of the second nonlinear resistance element in the third circuit block is connected to the third conductive line, wherein the second terminal of the first nonlinear resistance element in the fourth circuit block is connected to the second conductive line, and the second terminal of the second nonlinear resistance element in the fourth circuit block is connected to the fourth conductive line.

14. The circuit of claim 13, wherein the resistance change element in the first circuit block is switchable from a first resistance state to a second resistance state by a voltage applied between the first and third conductive lines.

15. The circuit of claim 13, wherein each of the first and second nonlinear resistance element is a diode.

16. The circuit of claim 13, wherein the first circuit block includes a programmable logic circuit having input and output terminals, the input terminal being connected to the fifth conductive line in the first circuit block, and the output terminal being connected to the sixth conductive line in the first circuit block.

17. The circuit of claim 13, wherein the first circuit block includes an inverter having input and output terminals, the input terminal being connected to the fifth conductive line in the first circuit block.

18. The circuit of claim 13, wherein the first circuit block includes an inverter having input and output terminals, the output terminal being connected to the sixth conductive line in the first circuit block.

19. The circuit of claim 13, wherein the first circuit block includes resistance change elements connected to the fifth conductive line in the first circuit block, a number of the resistance change elements which are in a low resistance state is one or zero.

* * * * *